(12) United States Patent
Hamao et al.

(10) Patent No.: US 9,277,648 B2
(45) Date of Patent: Mar. 1, 2016

(54) PRINTED WIRING BOARD AND INFORMATION PROCESSING APPARATUS

(71) Applicant: FUJITSU LIMITED, Kawasaki-shi, Kanagawa (JP)

(72) Inventors: Shotaro Hamao, Kawasaki (JP); Yoshiaki Tamura, Kawasaki (JP); Toshiki Kurosawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/570,290

(22) Filed: Dec. 15, 2014

(65) Prior Publication Data

US 2015/0208503 A1 Jul. 23, 2015

(30) Foreign Application Priority Data

Jan. 17, 2014 (JP) ................................. 2014-006969

(51) Int. Cl.
*H05K 1/11* (2006.01)

(52) U.S. Cl.
CPC ........ *H05K 1/115* (2013.01); *H05K 2201/0391* (2013.01)

(58) Field of Classification Search
USPC .................................. 257/686; 174/263, 261
See application file for complete search history.

(56) References Cited

U.S. PATENT DOCUMENTS

| 4,874,907 A * | 10/1989 | Ishikawa ............ G01R 31/2818 174/261 |
| 4,883,920 A * | 11/1989 | Tanabe ................. H05K 3/3442 174/263 |
| 2009/0178836 A1* | 7/2009 | Fujii ............................ 174/260 |

FOREIGN PATENT DOCUMENTS

| JP | 5-347473 A | 12/1993 | |
| JP | 8-32210 A | 2/1996 | |
| JP | 2002-353603 A | 12/2002 | |
| JP | 2003-243814 A | 8/2003 | |
| JP | 2009123872 | * 4/2009 | ............... H05K 3/34 |
| JP | 2009-123872 A | 6/2009 | |

* cited by examiner

*Primary Examiner* — Zandra Smith
*Assistant Examiner* — Lawrence Tynes, Jr.
(74) *Attorney, Agent, or Firm* — Westerman, Hattori, Daniels & Adrian, LLP

(57) ABSTRACT

A printed wiring board having a land for surface-mounting of an electronic component, includes the land having a pair of land pieces arranged in an opposing manner, and each of the land pieces including a plurality of land portions having widths different from each other, and a coupling portion partially coupling a boundary portion between a pair of adjacent ones of the land portions.

4 Claims, 16 Drawing Sheets

PRINTED WIRING BOARD AND INFORMATION PROCESSING APPARATUS

CROSS-REFERENCE TO RELATED APPLICATION

This application is based upon and claims the benefit of priority from the prior Japanese Patent Application No. 2014-006969 filed on Jan. 17, 2014, the entire contents of which are incorporated herein by reference.

FIELD

The embodiment discussed herein is related to a printed wiring board and an information processing apparatus.

BACKGROUND

As seen in mobile telephones, laptop computers, and the like, miniaturization and sophistication of electronic devices have become more and more notable recently. Along with the miniaturization and sophistication of electronic devices, printed wiring boards, which are mounted in the electronic devices, have also been miniaturized more and more, and thus there is a demand for a high-density mounting technique that mounts electronic components with different sizes in a narrow region of the printed wiring board.

In relation to this, proposed is a technique that mounts electronic components with different sizes in the same position on a flat surface of the printed wiring board. For example, there are known mounting lands of chip components that include an assembly of multiple land portions having widths respectively corresponding to electrode widths of multiple chip components having different chip sizes in which the multiple lands are combined and arranged in the form of T-shaped blocks in the assembly. These techniques are disclosed for example in Japanese Laid-open Patent Publication No. 2003-243814.

As described above, when multiple land portions are arranged by simply combining them in the form of T-shaped blocks, they are formed in such a manner that multiple land portions, on which electronic components having different sizes are to be mounted, are continuously connected. In this case, when solder is heated at the time of mounting the electronic components, electrode portions of the electronic components to be mounted are pulled toward the land portions for mounting the electronic components having different sizes due to the surface tension of the melted solder, which may cause displacement in mounting the electronic components and mounting defects.

SUMMARY

According to an aspect of the invention, A printed wiring board having a land for surface-mounting of an electronic component, includes the land having a pair of land pieces arranged in an opposing manner, and each of the land pieces including a plurality of land portions having widths different from each other, and a coupling portion partially coupling a boundary portion between a pair of adjacent ones of the land portions.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
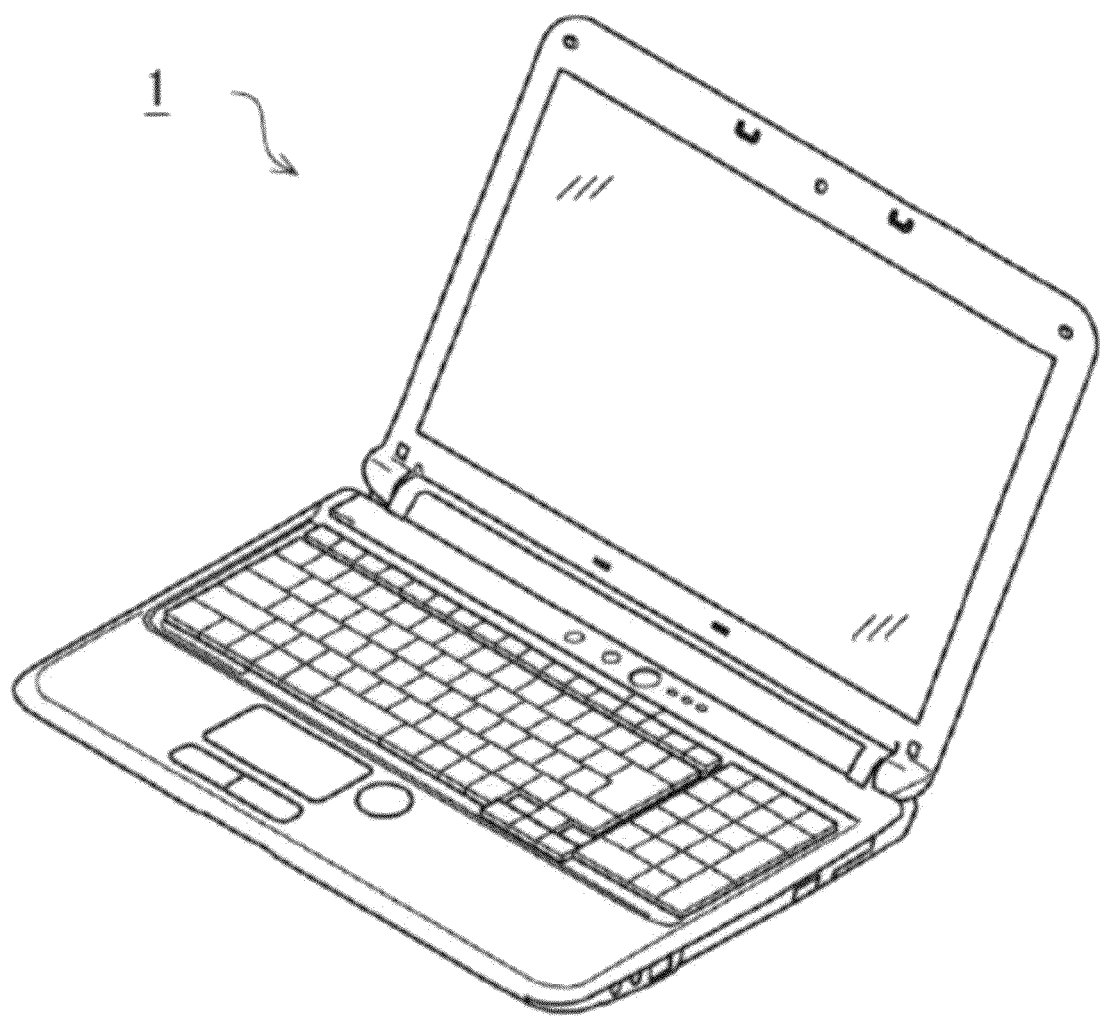
FIG. 1 is an external view of an information processing apparatus according to an embodiment.

Hereinafter, an embodiment relating to a printed wiring board and an information processing apparatus is described by referring to the drawings.

<Embodiment>

Figure 2:
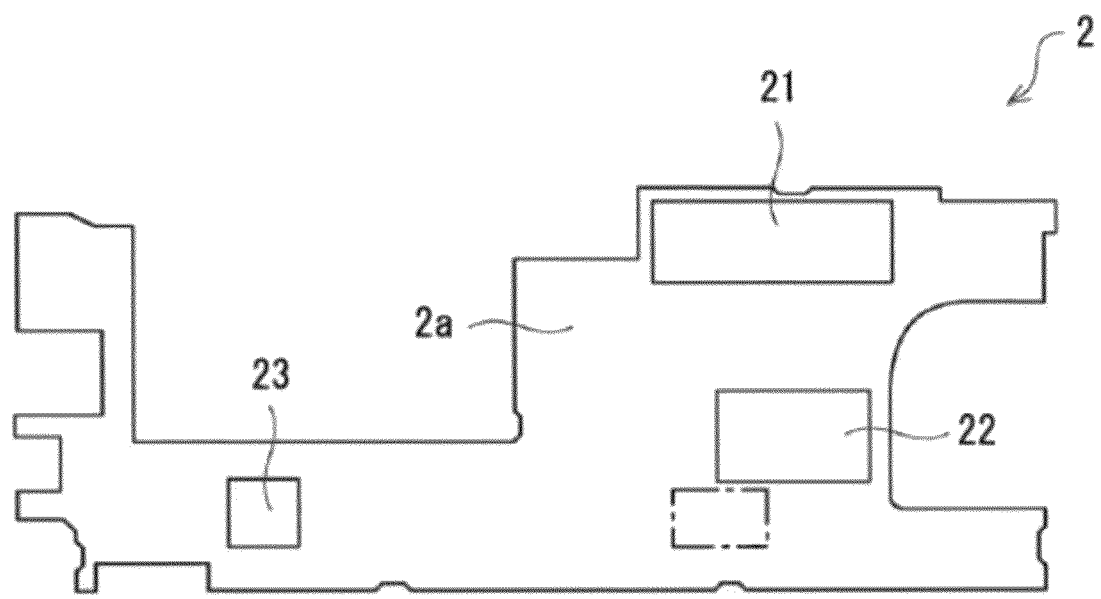
FIG. 2 is a top view of a printed wiring board according to the embodiment.

FIG. 1 is an external view of an information processing apparatus 1 according to an embodiment. In the embodiment, the information processing apparatus 1 is a laptop personal computer. A printed wiring board 2 illustrated in FIG. 2 is mounted in a case of the information processing apparatus 1. FIG. 2 illustrates a top surface of the printed wiring board 2. The printed wiring board 2 is a so-called motherboard, and has a memory 21, a processor 22, a power source IC 23, and the like mounted on the surface thereof. Furthermore, various electronic components such as various kinds of capacitors and resistors are mounted on the surface of the printed wiring board 2. It is to be noted that the laptop personal computer is given as an example of the information processing apparatus 1 in which the printed wiring board 2 is mounted, but the information processing apparatus 1 is not limited to the laptop personal computer.

Figure 3:
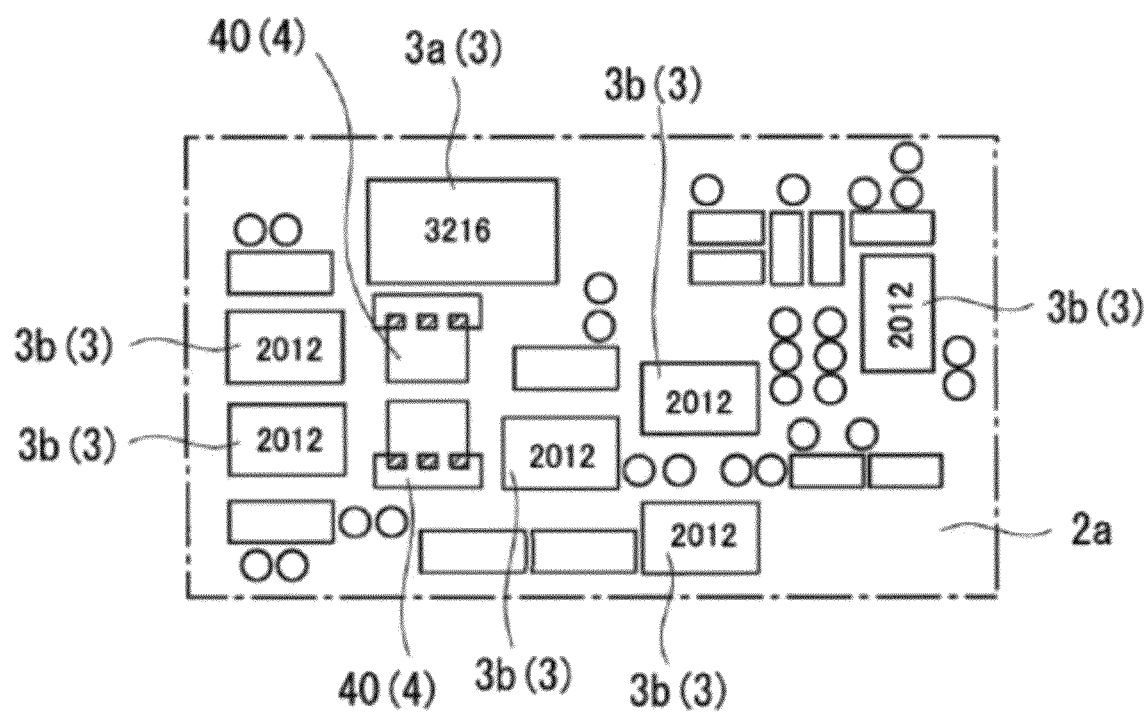
FIG. 3 is a partially enlarged diagram of the printed wiring board according to the embodiment.

FIG. 3 is a partially enlarged diagram of the printed wiring board 2 whose portion surrounded by a broken line in FIG. 2 is enlarged. As illustrated in FIG. 3, surface-mount chip components (electronic components) 3 are mounted on the surface of the printed wiring board 2. Multiple chip components 3 having chip sizes different from one another are mounted on a surface (hereinafter, referred to as a "mounting surface") 2a of the printed wiring board 2. The chip components 3 include a bypass capacitor, for example.

Hereinafter, among the chip components 3 which are surface-mounted on the printed wiring board 2, one with reference numeral 3a is referred to as a "large size chip component" and one with reference numeral 3b is referred to as a "small size chip component". The large size chip component 3a has a larger chip size than the small size chip component 3b. In the present embodiment, the large size chip component 3a is a square chip component with the size of 3216 (3.2 mm×1.6 mm). Also, the small size chip component 3b is a square chip component with the size of 2012 (2.0 mm×1.2 mm). These names of chip components based on the numbers such as 3216 and 2012 are standardized by the Japan Industrial Standard (JIS). It is to be noted that the above sizes of the large size chip component 3a and the small size chip component 3b are only exemplary and various kinds of sizes may be used.

Figure 4:
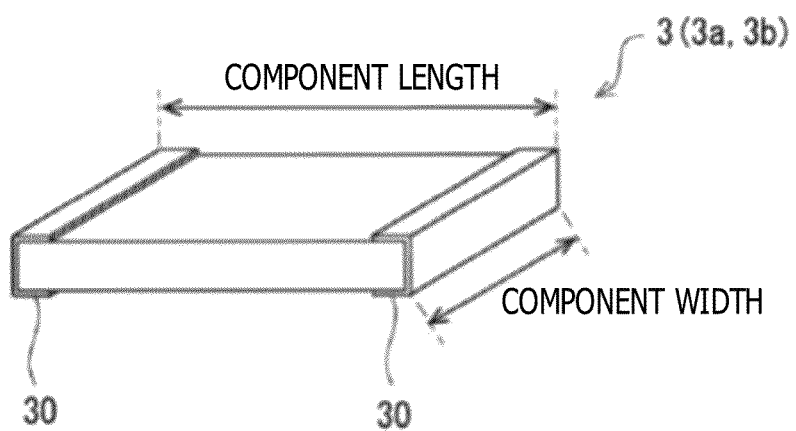
FIG. 4 is a diagram illustrating a chip component according to the embodiment.

FIG. 4 is a diagram illustrating the chip component 3 according to the embodiment. Electrodes 30 are provided on two sides of the chip component 3. Here, the large size chip component 3a is designed with a length of 3.2 mm on a long side and a length of 1.6 mm on a short side. The small size chip component 3b is designed with a length of 2.0 mm on a long side and a length of 1.2 mm on a short side. It is to be noted that when the large size chip component 3a and the small size chip component 3b are collectively referred in the embodiment, they are referred to as the "chip component 3". Also, the short side of the chip component 3 is referred to as a "component width" and the long side thereof is referred to as a "component length".

Figure 5:
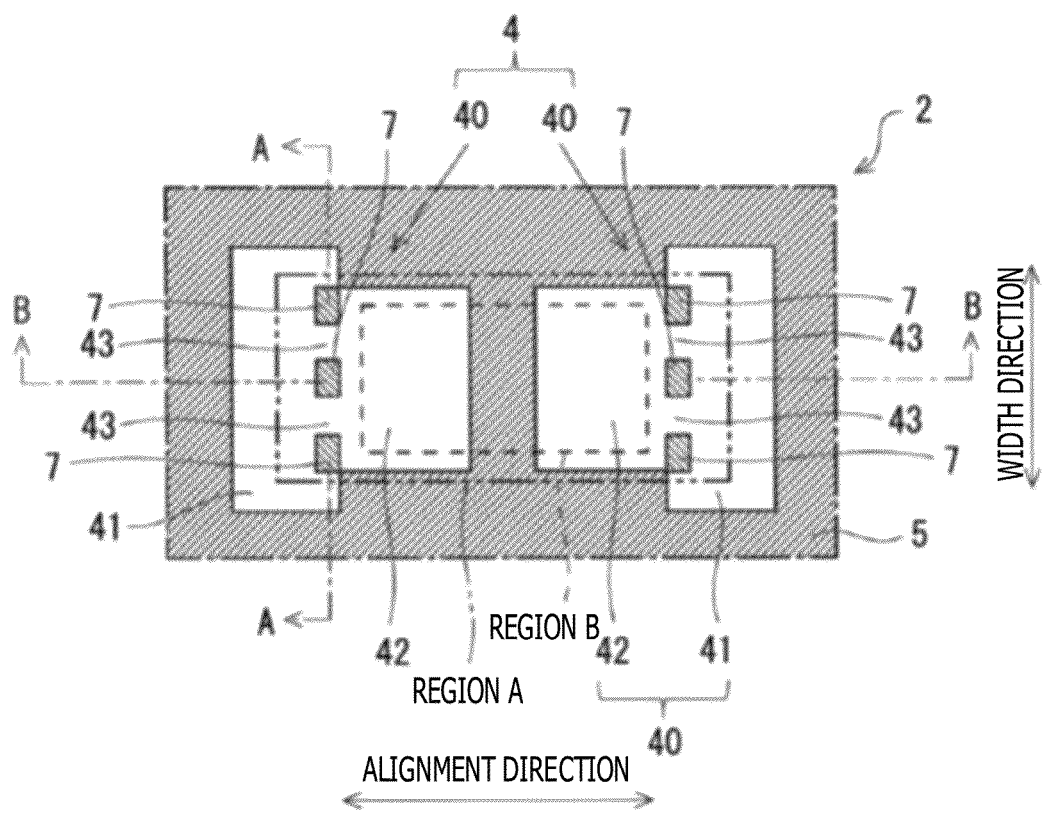
FIG. 5 is a top view of a land according to the embodiment.
Figure 6:
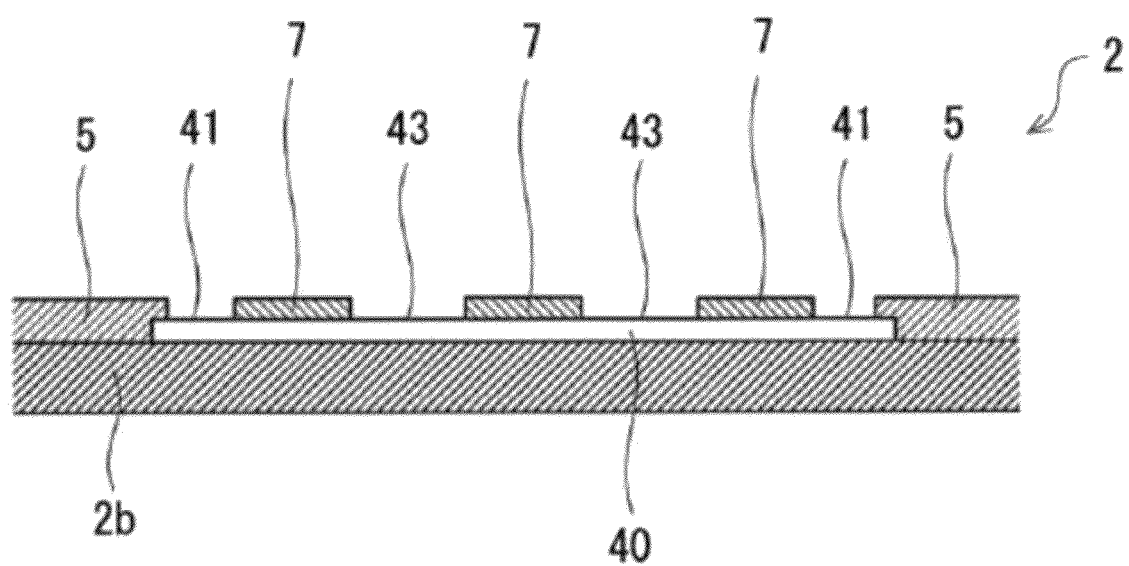
FIG. 6 is a diagram illustrating a cross-section taken along the arrow A-A in FIG. 5.
Figure 7:
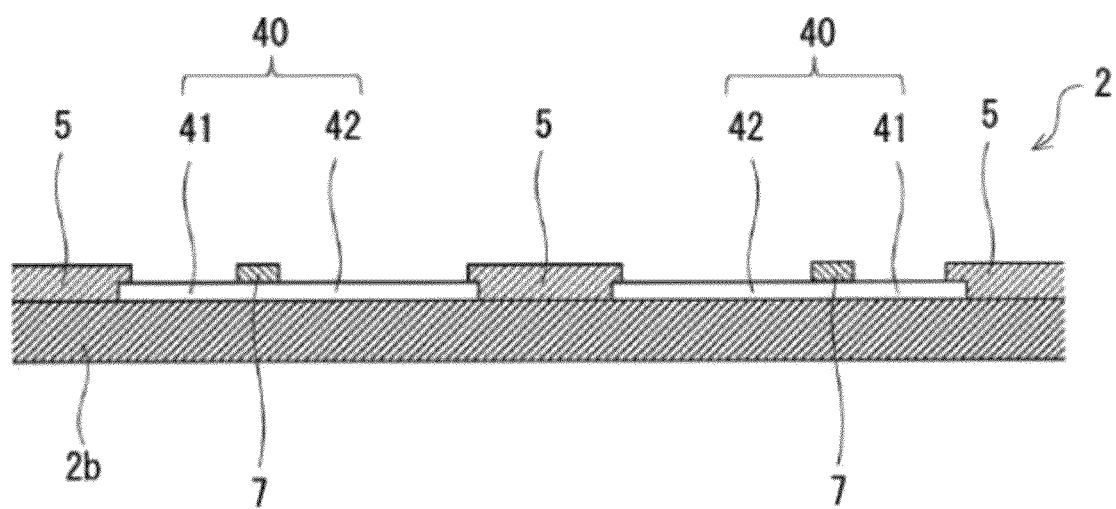
FIG. 7 is a diagram illustrating a cross-section taken along the arrow B-B in FIG. 5.

Next, the description is given to a land which is formed on the mounting surface 2a of the printed wiring board 2. Reference numeral 4 in FIG. 3 is a land for mounting the chip component 3 on the surface thereof (also referred to as a "pad"). The land 4 is a copper foil for solder which is formed in an exposed manner on the mounting surface 2a of the printed wiring board 2. FIG. 5 is the top view of the land 4 according to the embodiment. FIG. 6 illustrates a cross-sectional structure of the land 4 according to the embodiment. FIG. 6 illustrates a cross-section taken along the A-A arrow in FIG. 5. FIG. 7 illustrates a cross-section taken along the B-B arrow in FIG. 5. Reference numeral 2b in FIGS. 6 and 7 is an insulating layer of the printed wiring board 2.

The land 4 has a pair of land pieces 40, 40 which are arranged in an opposing manner with an interval of a predetermined width. The land 4 (the pair of land pieces 40, 40) is a copper foil formed in a lower layer of a solder resist 5, which is exposed through an opening of the solder resist 5 covering the mounting surface 2a of the printed wiring board 2.

As illustrated in FIGS. 5 to 7, the pair of land pieces 40, 40 have the same shape and the same size. To selectively solder the chip components 3 (the large size chip component 3a and the small size chip component 3b) whose chip sizes are different from each other in the same portion (position) on the flat surface of the printed wiring board 2, each of the land pieces 40, 40 is formed in the form of a flat T-shaped block.

Each of the pair of land pieces 40, 40, which are arranged in an opposing manner, has a first land portion 41 and a second land portion 42. In each of the land pieces 40, 40, the first land portion 41 and the second land portion 42 are arranged to be adjacent to each other and have widths different from each other. The "widths" of the first land portion 41 and the second land portion 42 are sizes in a direction perpendicular to an alignment direction in which the pair of land pieces 40, 40 arranged in an opposing manner are aligned (hereinafter, this direction is referred to as a "width direction"). As illustrated in FIG. 5, in each of the land pieces 40, 40, the first land portion 41 has a larger width as compared with the second land portion 42. The first land portion 41 and the second land portion 42 are examples of the multiple land portions having widths different from one another.

In each of the land pieces 40, 40, multiple rectangular resist portions 7 are arranged along the width direction of the land pieces 40, 40 in the boundary portion between the first land portion 41 and the second land portion 42. The resist portions 7 are formed by solder resists arranged on the copper foil forming the land pieces 40, 40 (the first land portion 41, the second land portion 42). Also, the resist portions 7 are arranged along the width direction of the land pieces 40, 40 with a predetermined interval.

In FIG. 5, reference numeral 43 is a portion on the copper foil forming the land pieces 40, 40 exposed from a gap between the adjacent resist portions 7 to the outside, and the portion is referred to as a "coupling portion" below. Coupling portions 43 are arranged in the boundary portion between the adjacent resist portions 7 and partially couples the boundary portion. In the boundary portion between the first land portion 41 and the second land portion 42 in each of the land pieces 40, 40, the resist portions 7 and the coupling portions 43 are alternately arranged along the width direction thereof.

As described above, the resist portions 7 are formed by the solder resist, which suppresses the flow (movement) of solder between the first land portion 41 and the second land portion 42 in each of the land pieces 40, 40. Then, the first land portion 41 and the second land portion 42 are coupled (connected) through the coupling portions 43, which allow the flow (movement) of solder between the both sides. The shapes and sizes of the resist portions 7 may be properly changed.

As described above, the coupling portions 43 in the land pieces 40, 40 face each other in the boundary position between the first land portion 41 and the second land portion 42 and are both sides extending in the width direction and also partially couple one side on the first land portion 41 with one side on the second land portion 42. On the other hand, the resist portions 7 in the land pieces 40, 40 face each other in the boundary position between the first land portion 41 and the second land portion 42 and are both sides extending in the width direction and partially isolate the one side on the first land portion 41 from the one side on the second land portion 42.

Also, as illustrated in FIG. 5, the pair of land pieces 40, 40 are arranged so that the second land portions 42 thereof face each other and the second land portions 42 are arranged on the inner side and the first land portions 41 are arranged in the outer side. As described above, the specification of the land 4 according to the embodiment is such that the chip components 3 whose chip sizes are different from each other (the large size chip component 3a, the small size chip component 3b) are selectively soldered in the same portion on the flat surface of the printed wiring board 2. To allow such a selective surface-mounting, the first land portion 41 and the second land portion 42 in each of the land pieces 40, 40 have widths respectively corresponding to component widths of the multiple chip components 3a and 3b whose chip sizes are different from one another.

For example, in FIG. 5, a region A surrounded by the alternate long and two short dashes line illustrates a mounting region when the large size chip component 3a with the size of 3216 is mounted on the land 4. In the embodiment, the width of the first land portion 41 is designed to have a size slightly larger than the component width of the large size chip component 3a. On the other hand, in FIG. 5, a region B surrounded by the broken line illustrates a mounting region when the small size chip component 3b with the size of 2012 is mounted on the land 4. The width of the second land portion 42 is designed to have a size slightly larger than the component width of the small size chip component 3b.

Figure 8:
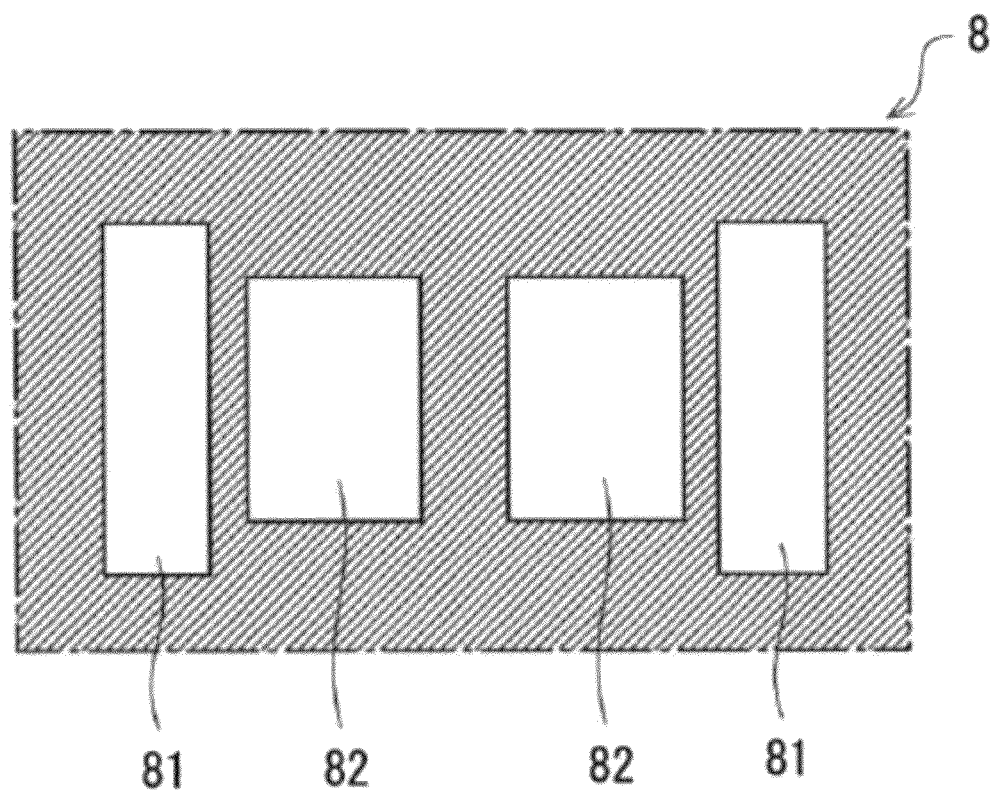
FIG. 8 is a diagram illustrating a metal mask according to the embodiment.
Figure 9:
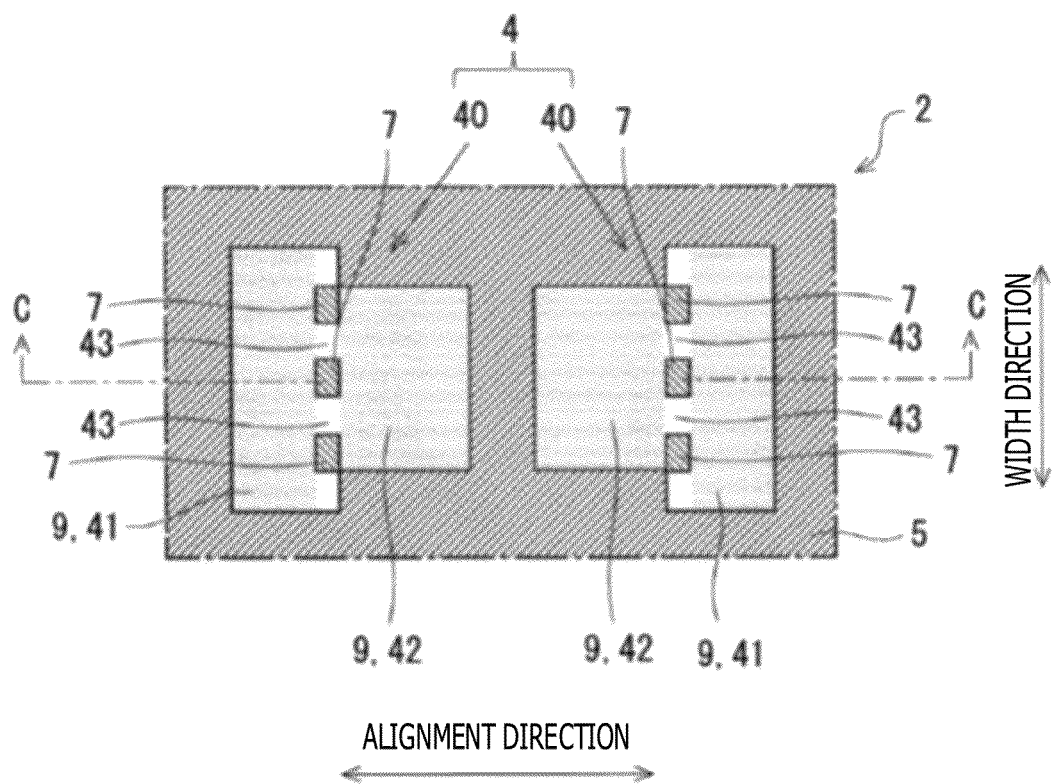
FIG. 9 is a diagram illustrating a state after solder paste is applied to the land according to the embodiment.
Figure 10:
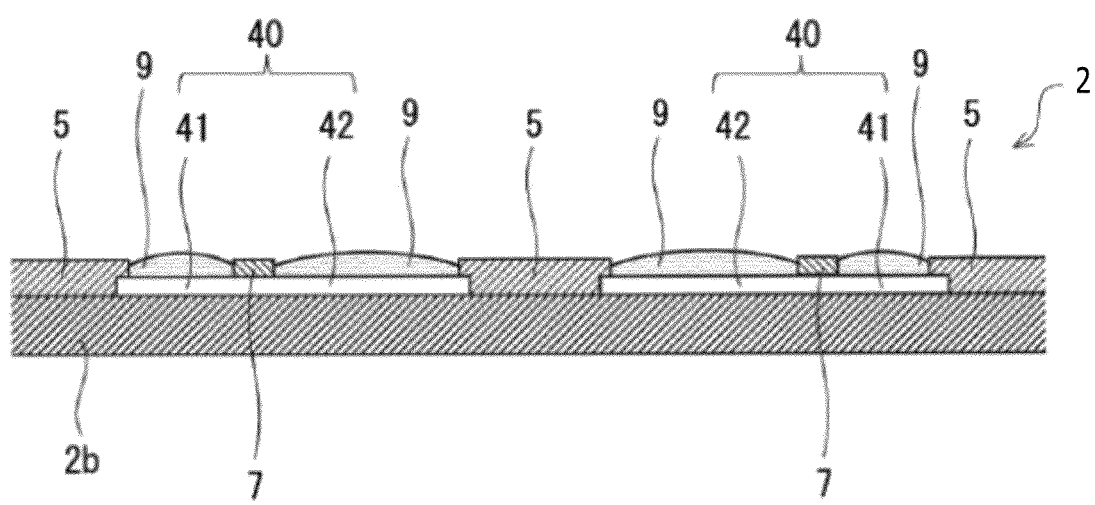
FIG. 10 is a cross-sectional diagram taken along the arrow C-C in FIG. 9.

Next, description is given to a method of mounting the chip component 3 on the land 4 formed on the mounting surface 2a of the printed wiring board 2. For example, a metal mask 8 as illustrated in FIG. 8 is prepared. The metal mask 8 is a jig which is used when a solder paste is printed on the land 4 and has two first openings 81 and two second openings 82. The first openings 81 are openings for applying the solder paste on the first land portions 41 in the land pieces 40, 40. The second openings 82 are openings for applying the solder paste on the second land portions 42 in the land pieces 40, 40. FIGS. 9 and 10 illustrate a state after the solder paste is applied to the land 4 using the metal mask 8. FIG. 9 illustrates the land 4 and a top view of the periphery thereof. FIG. 10 is a cross-sectional view taken along the C-C arrow in FIG. 9. Also, reference numeral 9 is the solder paste applied onto the first land portions 41 and the second land portions 42 in the land pieces 40, 40.

After the solder paste 9 is applied (printed) onto the land 4, one of the large size chip component 3a and the small size chip component 3b, which has to be mounted, is mounted in a predetermined position on the land 4 by using an automatic mounting device (chip mounter), for example. The description is given here to the case where the small size chip component 3b is firstly surface-mounted on the land 4. It is to be noted that the chip component 3 may be manually mounted on the land 4.

Figure 11:
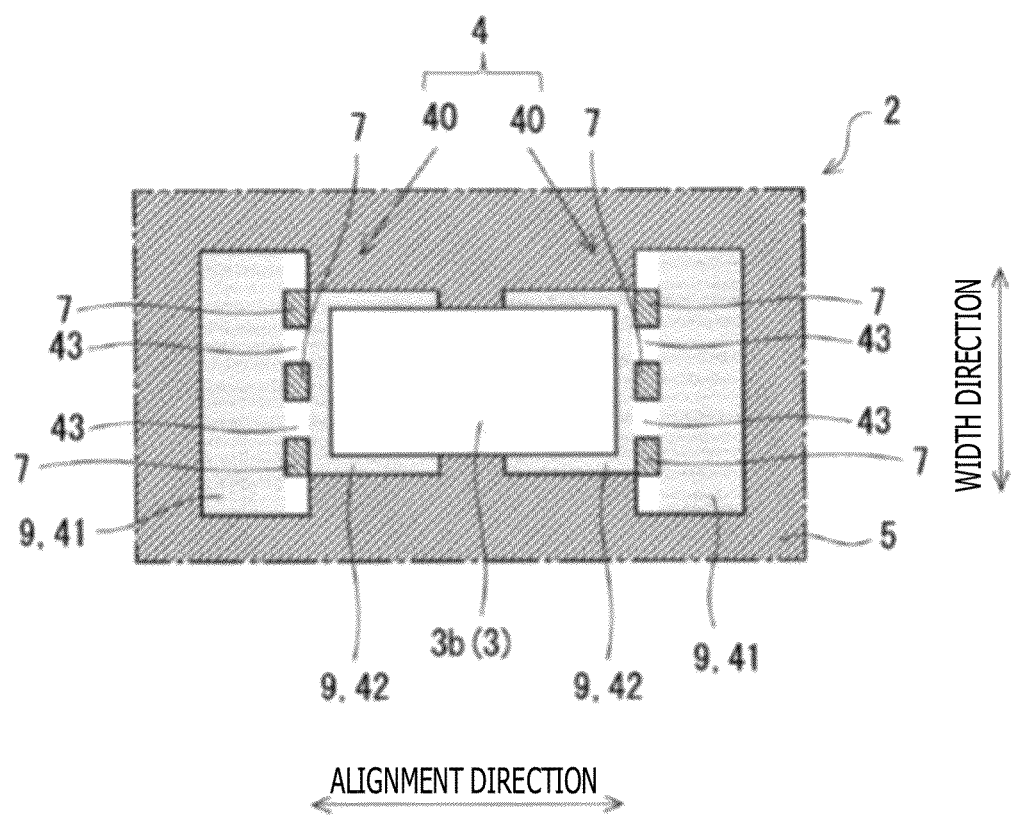
FIG. 11 is a diagram illustrating a state where a small size chip component is mounted on the land according to the embodiment.

As illustrated by the region B in FIG. 5, the small size chip component 3b is mounted on the region surrounded by the resist portions 7 of the pair of land pieces 40, 40, in other words, on the second land portions 42. FIG. 11 is a diagram illustrating a state where the small size chip component 3b is mounted on the land 4 according to the embodiment. As illustrated in FIG. 11, the small size chip component 3b is mounted on the second land portions 42 of the pair of land pieces 40, 40. Here, the interval between one resist portion 7 and other resist portion 7 in the pair of land pieces 40, 40 (hereinafter, referred to as a "resist facing interval") is designed to have a size in which a predetermined clearance is added to the component length of the small size chip component 3b. Also, the width of the second land portion 42 is designed to have size in which a predetermined clearance is added to the component width of the small size chip component 3b.

Next, a reflow process is performed. The reflow process includes heat treatment in which the printed wiring board 2 having the small size chip component 3b mounted thereon is put in a reflow furnace. In the reflow process, the solder paste 9 on the land 4 melts and melted solder paste 9 is absorbed by an electrode 30 on the small size chip component 3b. After that, the printed wiring board 2 is taken out from the reflow furnace, and when the solder paste 9 is cooled, the soldering of the small size chip component 3b on the mounting surface is terminated.

At the time of the reflow process, the surface tension of the melted solder paste 9 acts on the small size chip component 3b. In contrast, the land 4 according to the embodiment enables a difference between the width of the second land portion 42 and the component width of the small size chip component 3b to be smaller. Accordingly, the land 4 according to the embodiment may suppress large displacement of the small size chip component 3b in the width direction of the land 4 which is caused at the time of the reflow process.

In addition, on the land 4 according to the embodiment, the resist portions 7 are arranged in the width direction in the boundary position between the first land portion 41 and the second land portion 42 in each of the land pieces 40, 40. Since the solder paste 9 is not spread by the application, the resist portions 7 do not allow the small size chip component 3b to move at the time of the reflow process in the alignment direction (the direction perpendicular to the width direction) of the land pieces 40, 40. For this reason, properly setting the resist facing interval according to the component length of the small size chip component 3b can favorably suppress displacement of the small size chip component 3b in the alignment direction of the land pieces 40, 40.

As described above, the positional displacement (mounting displacement) of the small size chip component 3b may be preferably suppressed when the small size chip component 3b is surface-mounted.

Figure 12:
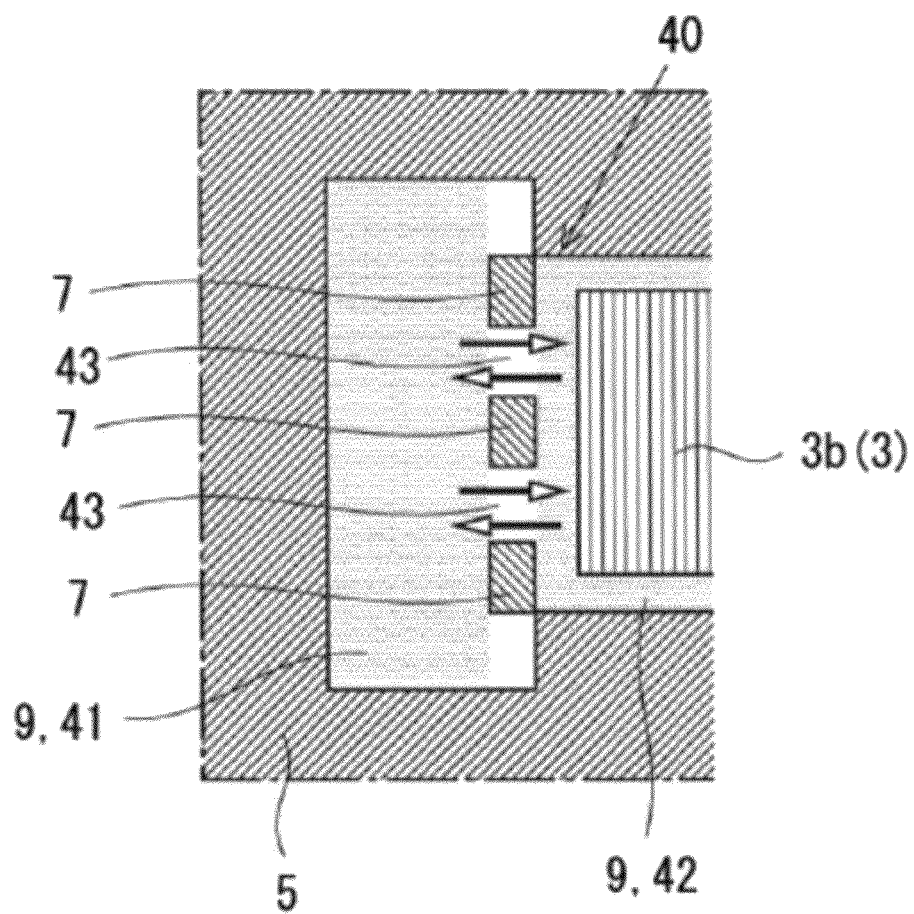
FIG. 12 is a diagram illustrating movements of solder paste melted in a reflow process.

Furthermore, on the land 4 according to the embodiment, the first land portion 41 and the second land portion 42 in each of the land pieces 40, 40, are intermittently isolated from each other by the resist portions 7 and intermittently connected with each other through the coupling portions 43. Accordingly, the solder paste 9 melted in the reflow process is allowed to flow through the coupling portions 43 arranged between the resist portions 7. In other words, as illustrated by an outline arrow in FIG. 12, in the reflow process, the solder paste 9 may be moved, in each of the land pieces 40, 40, from the first land portion 41 to the second land portion 42 or from the second land portion 42 to the first land portion 41 through the coupling portions 43.

At the time of mounting the small size chip component 3b, the solder paste 9 melted in the reflow process is absorbed by the electrode 30 of the the small size chip component 3b mounted on the second land portion 42. Accordingly, when the small size chip component 3b is mounted, the solder paste 9 is moved mainly from the first land portion 41 to the second land portion 42 through the coupling portions 43.

As described above, the land 4 according to the embodiment enables the solder paste 9 in the first land portion 41 to be supplied to the second land portion 42 through the coupling portions 43 when the small size chip component 3b is mounted. As a result, a solder fillet may be favorably formed in the connection portion between the electrode 30 of the small size chip component 3b and the second land portion 42 and thus connection defects due to non-adhesion may be suppressed.

Figure 13:
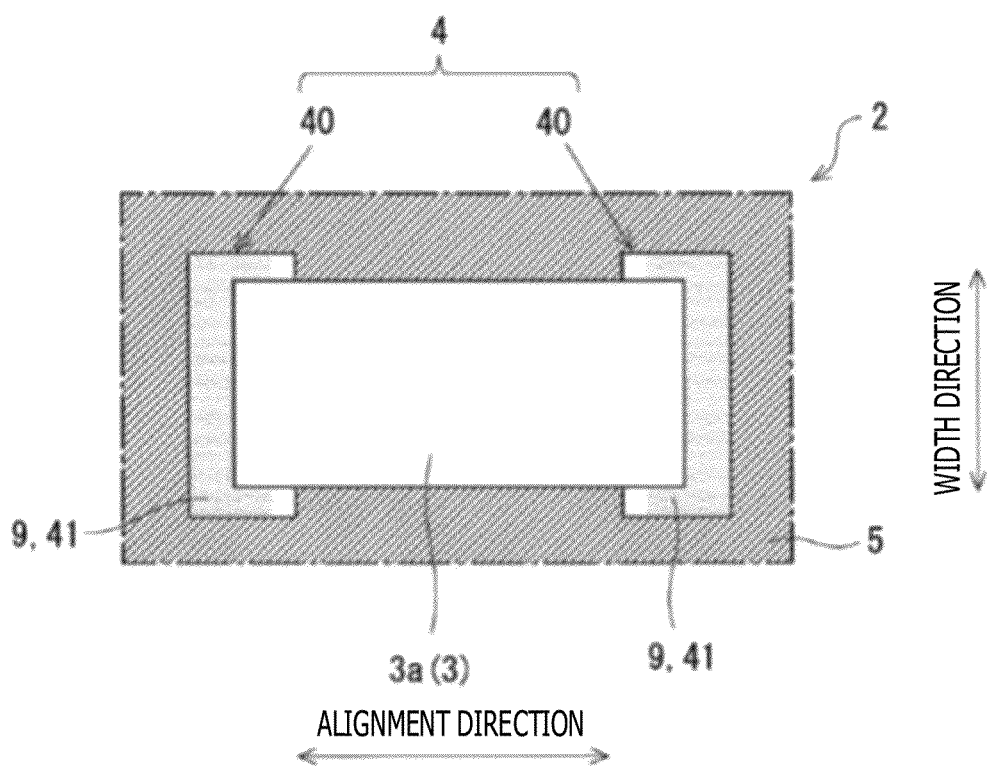
FIG. 13 is a diagram illustrating a state where a large size chip component is mounted on the land according to the embodiment.
Figure 14:
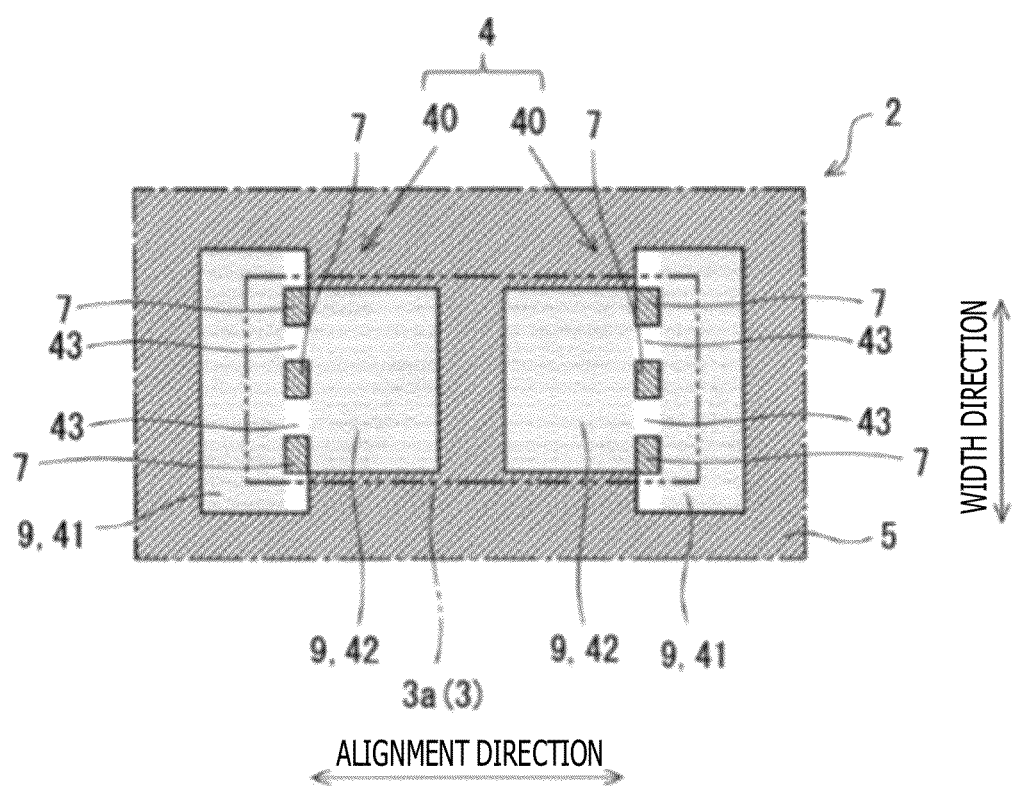
FIG. 14 is a perspective diagram of the large size chip component illustrated in FIG. 13.

Hereinafter, the description is given to a case where the large size chip component 3a is surface-mounted on the land 4. FIG. 13 is a diagram illustrating a state where the large size chip component 3a is mounted on the first land portion 41 of the pair of land pieces 40, 40. FIG. 14 is a perspective view of the large size chip component 3a illustrated in FIG. 13. The electrode 30 of the large size chip component 3a is mainly mounted on the first land portion 41 of each of the land pieces 40, 40. It is to be noted that in FIG. 14, for convenience, an outer shape of the large size chip component 3a is illustrated by an alternate long and two short dashes line. The printed wiring board 2 on which the large size chip component 3a is mounted is heated by the reflow furnace, so that the solder paste 9 on the land 4 is melted. Here, the width of the first land portion 41 is designed to have a size in which a predetermined clearance is added to the component width of the large size chip component 3a. Accordingly, a difference between the width of the first land portion 41 and the large size chip component 3a may become smaller. This suppresses large displacement of the large size chip component 3a in the width direction of the land 4 due to the surface tension of the melted solder paste 9, at the reflow process.

In addition, when the large size chip component 3a is mounted, the electrode 30 of the large size chip component 3a is mainly mounted on the first land portion 41 of each of the land pieces 40, 40. Here, the first land portion 41 and the second land portion 42 communicate with each other through the coupling portions 43, so that the solder paste 9 which exists on the second land portion 42 at the reflow process may be moved to the first land portion 41. Accordingly, a sufficient amount of the solder paste 9 may be supplied to the electrode 30 of the large size chip component 3a. Thus, a solder fillet may be preferably formed in the connection portion between the electrode 30 of the large size chip component 3a and the first land portion 41. As a result, a poor connection of the large size chip component 3a may be preferably suppressed.

As described above, with the land 4 according to the embodiment, electronic components with different sizes may be mounted in the same position on the flat surface of the printed wiring board 2 and, at the same time, displacement in mounting the electronic components or mounting defect may be suppressed.

Figure 15:
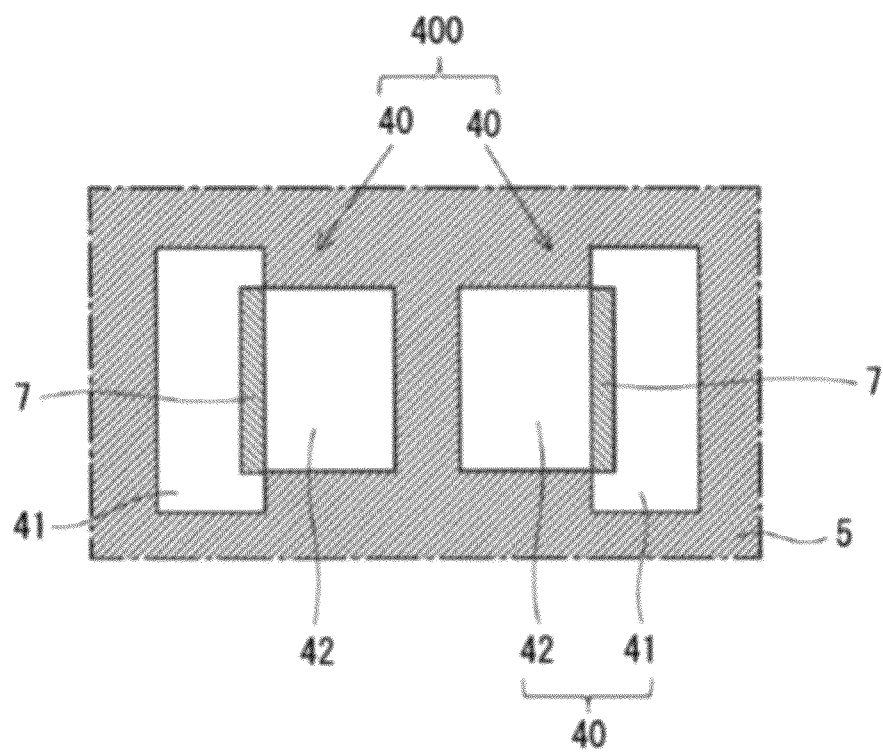
FIG. 15 is a diagram illustrating a land according to a comparative example.

Here, mount checking tests of the large size chip component 3a with the size of 3216 and the small size chip component 3b with the size of 2012 are carried out on the land 4 according to the embodiment (an example) and a land 400 (a comparative example) illustrated in FIG. 15. In the land 400 according to the comparative example, a first land portion 41 and a second land portion 42 of a pair of land pieces 40, 40 are completely isolated by resist portions 7. As for the small size chip component 3b with the size of 2012, mounting displacement and poor connection (non-adhesion) are not generated in both the example and the comparative example. On the other hand, as for the mount checking test of the large size chip component 3a, a percentage of generating the mounting displacement and the poor connection in the example may be reduced by 62% as compared with the comparative example.

As described above, the description is given to the printed wiring board 2 with the land 4 and the information processing apparatus 1 in accordance with the embodiment. However, it is obvious for those who are in the art that various modifications, improvements, and combinations thereof are possible about the embodiment. For example, in the embodiment, the printed wiring board 2 mounted in the information processing apparatus 1 is described as an example, but the land 4 described above may be applied to a testing substrate for determining an optimum capacity of a bypass capacitor which is interposed between an electrode and a ground.

Figure 16:
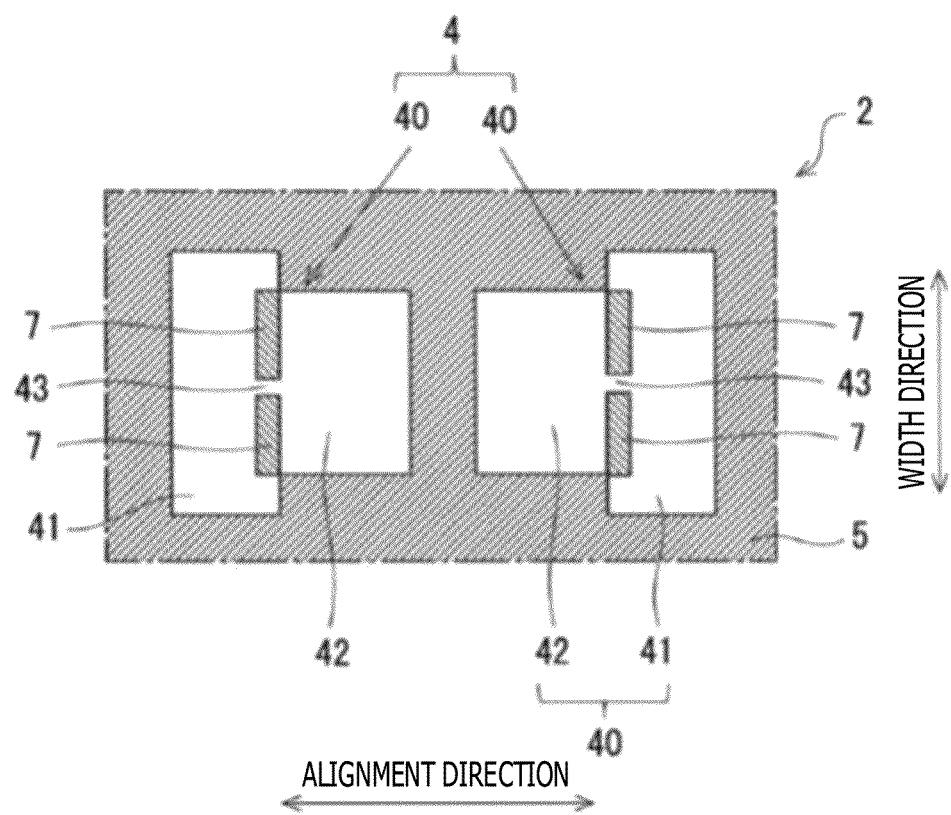
FIG. 16 is a diagram illustrating a land according to a modified embodiment.

In addition, the description is given in the embodiment to the example in which the two coupling portions 43 are arranged in the boundary portion between the first land portion 41 and the second land portion 42 in each of the land pieces 40, 40. However, the number of the coupling portions 43 may be properly changed. For example, as illustrated in a modified embodiment in FIG. 16, one coupling portion 43 may be disposed in a boundary portion between a first land portion 41 and a second land portion 42. It is of course natural that three or more coupling portions 43 are disposed in a boundary portion between the first land portion 41 and the second land portion 42. Also, each of the pair of land pieces 40, 40 of the land 4 may include three or more land portions having different width sizes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed wiring board having a land for surface-mounting of an electronic component, comprising:
   the land having a pair of land pieces arranged in an opposing manner, and
   each of the land pieces including
   a plurality of land portions having widths different from each other, and
   a coupling portion partially coupling a boundary portion between a pair of adjacent ones of the land portions, wherein
   in the boundary portion between the pair of land portions, a plurality of resist portions for suppressing a flow of solder between the pair of land portions are arranged along a width direction of the land pieces, and the coupling portion is disposed between adjacent ones of the resist portions.

2. The printed wiring board according to claim 1, wherein in the boundary portion between the pair of land portions, a plurality of the coupling portions are arranged along the width direction.

3. The printed wiring board according to claim 1, wherein widths of the plurality of land portions in the land pieces respectively correspond to widths of a plurality of electronic components having different sizes.

4. An information processing apparatus including a printed wiring board having a land for surface-mounting of an electronic component, wherein
   the land has a pair of land pieces, and
   each of the land pieces includes
   a plurality of land portions having widths different from each other, and
   a coupling portion partially coupling a boundary portion between a pair of adjacent ones of the land portions, and wherein
   in the boundary portion between the pair of land portions, a plurality of resist portions for suppressing a flow of solder between the pair of land portions are arranged along a width direction of the land pieces, and the coupling portion is disposed between adjacent ones of the resist portions.

* * * * *